(12) United States Patent
Zhang

(10) Patent No.: US 11,758,753 B2
(45) Date of Patent: Sep. 12, 2023

(54) DISPLAY MOTHERBOARD

(71) Applicant: TCL CHINA STAR OPTOELECTRONICS TECHNOLOGY CO., LTD., Shenzhen (CN)

(72) Inventor: Min Zhang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 413 days.

(21) Appl. No.: 17/053,658

(22) PCT Filed: Sep. 15, 2020

(86) PCT No.: PCT/CN2020/115189
§ 371 (c)(1),
(2) Date: Nov. 6, 2020

(87) PCT Pub. No.: WO2022/032785
PCT Pub. Date: Feb. 17, 2022

(65) Prior Publication Data
US 2023/0056563 A1    Feb. 23, 2023

(30) Foreign Application Priority Data
Aug. 11, 2020 (CN) .......................... 202010799752.4

(51) Int. Cl.
*H10K 50/842* (2023.01)
*H10K 71/00* (2023.01)

(52) U.S. Cl.
CPC ......... *H10K 50/8426* (2023.02); *H10K 71/00* (2023.02); *H10K 71/851* (2023.02)

(58) Field of Classification Search
None
See application file for complete search history.

(56) References Cited

U.S. PATENT DOCUMENTS

2014/0097430 A1    4/2014  Park
2015/0034935 A1    2/2015  Choi
(Continued)

FOREIGN PATENT DOCUMENTS

CN    104102037 A    10/2014
CN    104678658 A    6/2015
(Continued)

OTHER PUBLICATIONS

International Search Report in International application No. PCT/CN2020/115189, dated May 11, 2021.
(Continued)

*Primary Examiner* — J. E. Schoenholtz
(74) *Attorney, Agent, or Firm* — PV IP PC; Wei Te Chung; Zhigang Ma

(57) ABSTRACT

A display motherboard is provided. The display motherboard is provided with barrier walls on at least one of an array substrate or a cover plate in a non-display region, so that stress generated by a cutting will be blocked and released by the barrier walls when the display motherboard is cut. Therefore, the stress will not enter the sealant and the display region, and the stress is released, thereby to prevent microcracks in the sealant and even fractures in films of the display motherboard. Moreover, the stress cannot enter the display region, and the encapsulation of the display region is complete.

18 Claims, 4 Drawing Sheets

(56) References Cited

U.S. PATENT DOCUMENTS

| | | | | |
|---|---|---|---|---|
| 2015/0311409 A1* | 10/2015 | Huang | ................. | G02F 1/1333 257/99 |
| 2019/0181362 A1* | 6/2019 | Tian | ..................... | H10K 50/844 |
| 2020/0058899 A1* | 2/2020 | Bu | ............................ | C09J 7/30 |
| 2020/0335711 A1* | 10/2020 | Zhang | .................. | H10K 77/111 |
| 2021/0104700 A1* | 4/2021 | Chen | .................. | H10K 50/8426 |
| 2021/0167305 A1* | 6/2021 | Liu | ...................... | H10K 59/123 |
| 2021/0313541 A1* | 10/2021 | Zou | .................... | H10K 50/8426 |
| 2021/0351372 A1* | 11/2021 | Luo | ........................ | H10K 71/00 |
| 2022/0238822 A1* | 7/2022 | Lu | .......................... | H10K 10/46 |
| 2022/0384541 A1* | 12/2022 | Cheng | ............... | H10K 50/8426 |

FOREIGN PATENT DOCUMENTS

| | | |
|---|---|---|
| CN | 105093632 A | 11/2015 |
| CN | 105097885 A | 11/2015 |
| CN | 106450038 A | 2/2017 |
| CN | 106549116 A | 3/2017 |
| CN | 107342371 A | 11/2017 |
| CN | 107634071 A | 1/2018 |
| CN | 107863357 A | 3/2018 |
| CN | 207352324 U | 5/2018 |
| CN | 207381019 U | 5/2018 |
| CN | 208271900 U | 12/2018 |
| CN | 109613739 A | 4/2019 |
| CN | 110596939 A | 12/2019 |
| WO | WO-2008099988 A1 * | 8/2008 ....... G02F 1/133351 |

OTHER PUBLICATIONS

Written Opinion of the International Searching Authority in International application No. PCT/CN2020/115189, dated May 11, 2021.
Chinese Office Action issued in corresponding Chinese Patent Application No. 202010799752.4 dated Mar. 12, 2021, pp. 1-10.

* cited by examiner (a)

(b)

(c)

$\left.\begin{array}{l}411\\412\\413\end{array}\right\}218$

DISPLAY MOTHERBOARD

This application is a Notional Phase of PCT Patent Application No. PCT/CN2020/115189 having international filing date of Sep. 15, 2020, which claims priority to Chinese Patent Application No. 202010799752.4, filed on Aug. 11, 2020, the entire contents of which are incorporated by reference in this application.

FIELD OF INVENTION

The present application relates to the field of display technologies, and in particular to a display motherboard.

BACKGROUND OF INVENTION

After a current organic light-emitting diode (OLED) display motherboard is encapsulated, the OLED display motherboard will be cut to form multiple OLED display panels. However, the OLED display motherboard is processed by a cutting wheel in a cutting process, and it is necessary to apply a certain pressure to the cutting wheel during cutting, where the cutting wheel forms a cutting line on the OLED display motherboard, and the cutting line is composed of multiple microcracks. When the cutting wheel squeezes the OLED display motherboard, the microcracks will spread along a thickness direction, resulting in the microcracks extending to a sealant. As a result, the sealant has microcracks and a non-tight bond between the sealant and a substrate, or stress extends to the sealant, resulting in holes in the sealant, and invasion of water-oxygen in a luminescent material from the microcracks or holes in the sealant, resulting in failure of the OLED display panel encapsulation. Even when the cracks spread to a certain extent and the stress extends to a display region, film layers of the OLED display panel will be broken, and the OLED display panel encapsulation will fail.

Therefore, when a conventional display motherboard is cut, a technical problem of encapsulation failure is existed that a greater cutting stress causes microcracks in the sealant or cracks in films of the display panel.

SUMMARY OF INVENTION

Technical Problem

Embodiments of the present application provide a display motherboard to alleviate a technical problem of encapsulation failure when a conventional display motherboard is cut, where a greater cutting stress causes microcracks in the sealant or cracks in films of the display panel.

Technical Solutions

To solve the above problem, technical solutions provided by the present application are as follows.

An embodiment of the present application provides a display motherboard, the display motherboard includes a plurality of display panels and a cutting region arranged between the display panels, wherein each of the display panels includes:

a display region; and a non-display region arranged between the display region and the cutting region, wherein the display panel further includes an array substrate and a cover plate, at least one of the array substrate or the cover plate is provided with a plurality of barrier walls in the non-display region, and the barrier walls are configured to block and release cutting stress.

In some embodiments, the display motherboard is an organic light-emitting diode (OLED) display motherboard, a light-emitting functional layer is positioned in the display region, an encapsulation glue is provided in the non-display region, and the encapsulation glue is arranged around the light-emitting functional layer.

In some embodiments, a plurality of first barrier walls are provided on the array substrate, and a height of the first barrier walls is less than a distance between the array substrate and the cover plate.

In some embodiments, a plurality of second barrier walls are provided on the cover plate, and a height of the second barrier walls are less than a distance between the array substrate and the cover plate.

In some embodiments, a plurality of third barrier walls are provided on the array substrate, a plurality of fourth barrier walls are provided on the cover plate, and the third barrier walls and the fourth barrier walls are arranged in stagger.

In some embodiments, a distance defined between adjacent third barrier walls is equal, and a distance defined between adjacent fourth barrier walls is equal.

In some embodiments, the distance between the adjacent third barrier walls is equal to the distance between the adjacent fourth barrier walls, and distances defined between the third barrier walls and adjacent fourth barrier walls are equal to one half of the distance between the third barrier walls.

In some embodiments, a height of the third barrier walls ranges from one half to two-thirds of a distance between the array substrate and the cover plate.

In some embodiments, a height of the fourth barrier walls ranges from one half to two-thirds of a distance between the array substrate and the cover plate.

In some embodiments, a plurality of fifth barrier walls are provided on the array substrate, a plurality of sixth barrier walls are provided on the cover plate, the fifth barrier walls and the sixth barrier walls are arranged correspondingly, a height of the fifth barrier walls is less than one-half of a distance between the array substrate and the cover plate, and a height of the sixth barrier walls is less than one half of the distance between the array substrate and the cover plate.

In some embodiments, the display motherboard is a liquid crystal display motherboard.

In some embodiments, the liquid crystal display motherboard is a liquid crystal display panel, the liquid crystal display panel includes the array substrate, a first substrate arranged opposite to the array substrate, and a liquid crystal layer disposed between the array substrate and the first substrate.

In some embodiments, the first substrate is a color filter substrate.

In some embodiments, the barrier walls include a light-shielding layer, a buffer layer, and a photoresist layer, the buffer layer is disposed between the light-shielding layer and the photoresist layer, and the light-shielding layer is in contact with at least one of the array substrate or the cover plate.

In some embodiments, a material of the light-shielding layer includes at least one of copper, aluminum, or titanium.

In some embodiments, a material of the buffer layer includes at least one of silicon oxide or silicon nitride.

In some embodiments, a material of the photoresist layer includes polyimide.

In some embodiments, a cross-sectional shape of the barrier walls includes rectangular, inverted trapezoidal, or triangular.

In some embodiments, a width of the barrier walls ranges from 1 micrometer to 20 micrometers.

In some embodiments, a height of the barrier walls ranges from 1 micrometer to 20 micrometers.

Beneficial Effect

An embodiment of the present application provides a display motherboard, the display motherboard includes a plurality of display panels and a cutting region arranged between the display panels. Each of the display panels includes a display region, and a non-display region arranged between the display region and the cutting region; wherein the display panel includes an array substrate and a cover plate, at least one of the array substrate or the cover plate is provided with a plurality of barrier walls in the non-display region, and the barrier walls are configured to block and release cutting stress. By setting the barrier walls on at least one of the array substrate or the cover plate in the non-display region, stress generated by the cutting will be blocked and released by the barrier walls when the display motherboard is cut. So that the stress will not enter a sealant and the display region, and the stress is released, thereby to prevent microcracks in the sealant and even fractures in films of the display motherboard. Moreover, the stress cannot enter the display region, and an encapsulation of the display region is complete, thereby alleviating a technical problem of encapsulation failure when a conventional display motherboard is cut, where a greater cutting stress causes microcracks in the sealant or cracks in films of the display panel.

DETAILED DESCRIPTION OF EMBODIMENTS

The present application provides a display motherboard. In order to illustrate the technical solutions of the present application or the related art in a clearer manner, the present application will be further described in detail below with reference to the accompanying drawings and embodiments. It should be understood that the specific embodiments described herein are only used to explain the present application, and not used to limit the present application.

An embodiment of the present application is directed to technical problem of encapsulation failure when a conventional display motherboard is cut, where a greater cutting stress causes cracks in a display panel. The embodiment of the present application is used to alleviate such technical problem.

Figure 1:
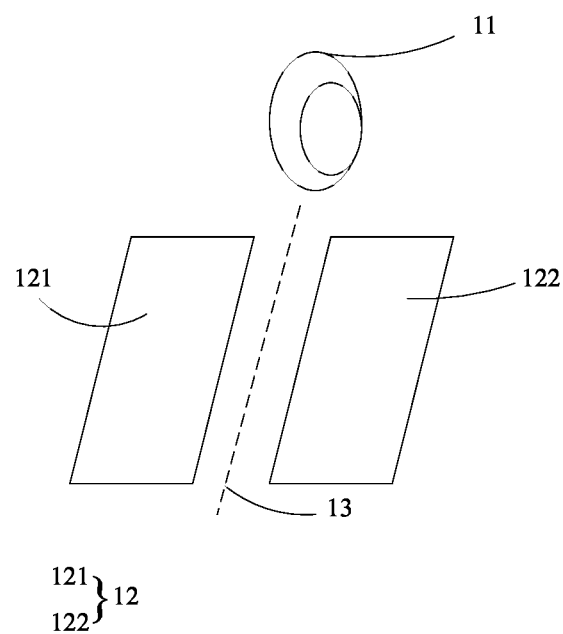
FIG. 1 is a schematic diagram of a conventional cutting wheel cutting a display motherboard.
Figure 2:
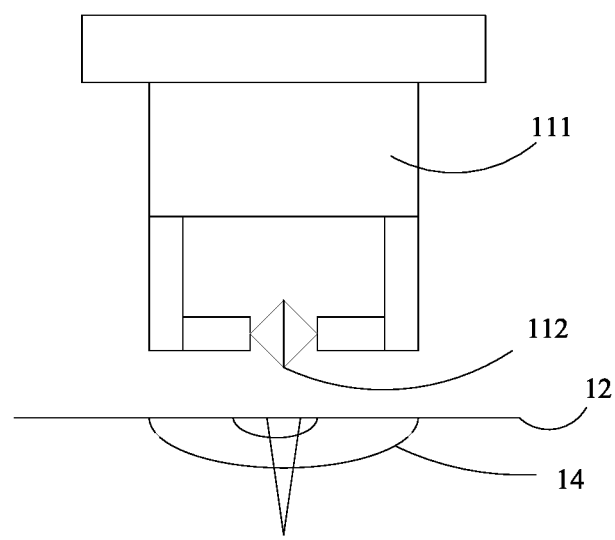
FIG. 2 is a schematic diagram of crack propagation when the conventional cutting wheel cuts the display motherboard.

As shown in FIG. 1, in a conventional display panel manufacturing process, after a display motherboard 12 is fabricated, a cutting wheel 11 needs to be configured to cut the display motherboard 12 into a plurality of display panels, such as a first display panel 121 and a second display panel 122 in FIG. 1. The cutting wheel 11 will cut along a cutting line 13 during cutting. The cutting wheel 11 includes a cutter seat 111 and a cutter wheel 112. When cutting the display motherboard 12, and it is necessary to apply a certain pressure to the cutting wheel during cutting, to make the cutting wheel force the certain pressure on the display motherboard, and the cutting line is composed of multiple microcracks. So that when the display motherboard is squeezed, as shown in FIG. 2, the microcracks 14 will spread along a thickness direction, after the microcracks spread to a certain extent, the microcracks extending to a sealant or even a display region, resulting in the microcracks or holes in the sealant and even fractures of film layers of the display panel, and resulting in water-oxygen intrusion and failure of display panel encapsulation. Therefore, when the conventional display motherboard is cut, there is a technical problem that a greater cutting stress causes the microcracks in the sealant or the film layers of the display panel broken, and failure of the encapsulation.

Figure 3:
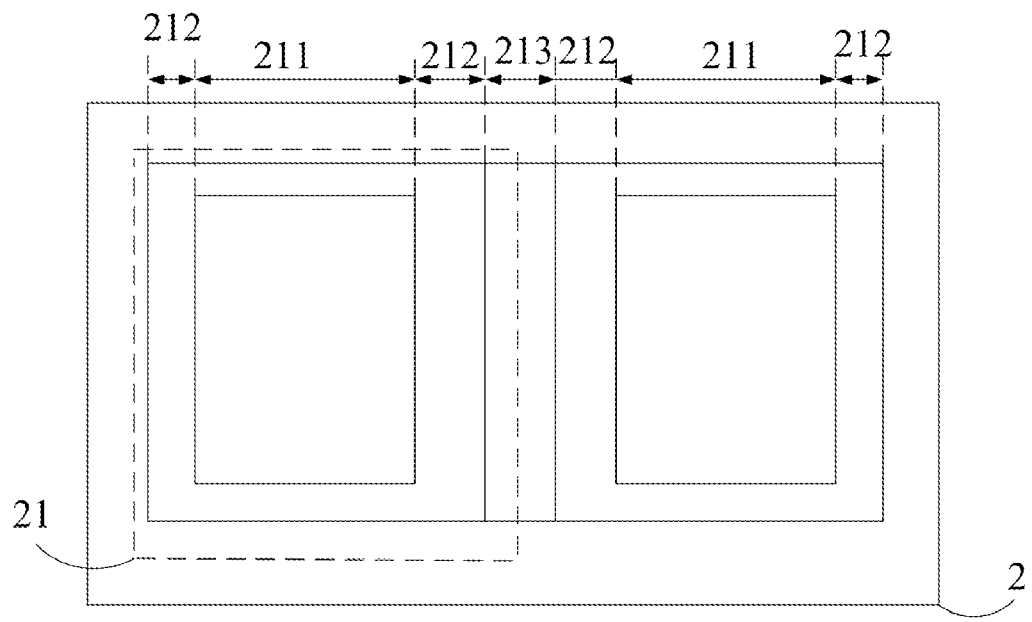
FIG. 3 is a first schematic diagram of a display motherboard provided by an embodiment of the present application.
Figure 4:
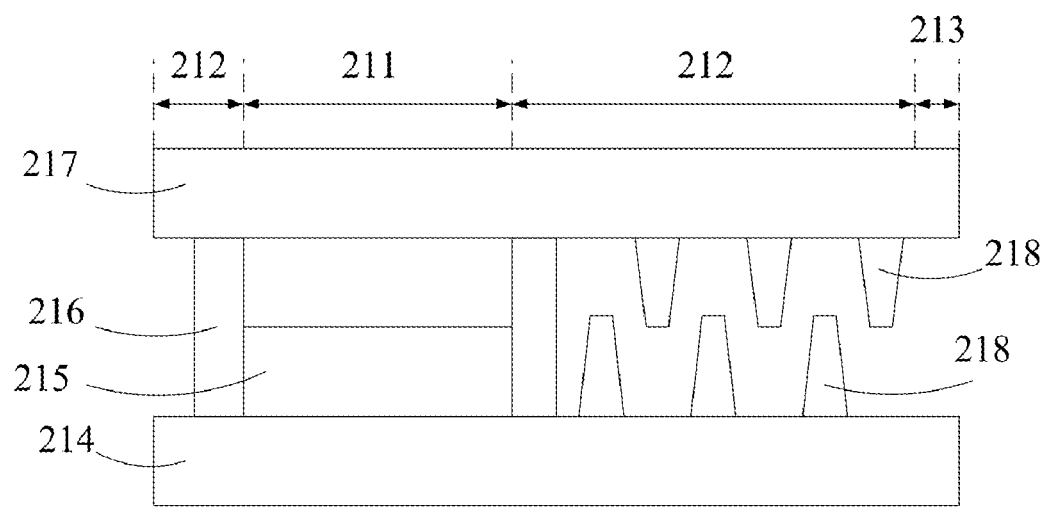
FIG. 4 is a second schematic diagram of a display motherboard provided by an embodiment of the present application.

As shown in FIG. 3 and FIG. 4, an embodiment of the present application provides a display motherboard, which the display motherboard 2 includes a plurality of display panels 21 and a cutting region 213 arranged between the display panels 21. The display panel 21 includes:

a display region 211; and a non-display region 212 arranged between the display region 211 and the cutting region 213;

wherein the display panel 21 includes an array substrate 214 and a cover plate 217, at least one of the array substrate 214 and the cover plate 217 is provided with a plurality of barrier walls 218 in the non-display region 212, and the barrier walls 218 are configured to block and release cutting stress.

An embodiment of the present application provides the display motherboard, the display motherboard includes the display panels and the cutting region arranged between the display panels. Each of the display panels includes the display region, and the non-display region arranged between the display region and the cutting region. Wherein, the display panel includes the array substrate and the cover plate, at least one of the array substrate or the cover plate is provided with the barrier walls in the non-display region, and the barrier walls are configured to block and release cutting stress. By setting the barrier walls on at least one of the array substrate or the cover plate in the non-display region, stress generated by the cutting will be blocked and released by the barrier walls when the display motherboard is cut. So that the stress will not enter a sealant and the display region, and the stress is released, thereby to prevent microcracks in the sealant and even fractures in films of the display motherboard. Moreover, the stress cannot enter the display region, and an encapsulation of the display region is complete, thereby alleviating the technical problem of encapsulation failure when the conventional display motherboard is cut, where the greater cutting stress causes microcracks in the sealant or cracks in films of the display panel.

In an embodiment, as shown in FIG. 4, the display motherboard includes an organic light-emitting diode (OLED) display motherboard, the display region 211 is provided with a light-emitting functional layer 215, and the non-display region is provided with an encapsulation glue 216. The encapsulation glue 216 is arranged around the light-emitting functional layer 215. In a cutting process of the OLED display motherboard, in order to prevent the cracks extending into the encapsulation glue when the OLED display motherboard is cut into multiple OLED display panels, which leads to microcracks in the encapsulation glue and even causes the OLED display panel to break and the encapsulation failure. By setting barrier walls on at least one of the cover plate and the array substrate in the OLED display panel. Even the stress is large, when the stress spreads to the display region, due to the setting of the barrier walls, the barrier walls will block the stress, or when the stress is transferred to the barrier walls, the barrier walls will release the stress. Therefore, the stress will disappear outside the sealant in the non-display region, and the stress will not extend to the sealant and the display region Therefore, the sealant and the display region are protected, and the sealant and the film layers of the OLED display panel is prevented from being broken, the encapsulation is complete, and the OLED display panel can work normally.

In an embodiment, a plurality of first barrier walls are provided on the array substrate, and a height of the first barrier wall is less than a distance between the array substrate and the cover plate. By setting barrier walls on the array substrate and cover plate to block and release the cutting stress. The first barrier walls can be arranged on a side of the array substrate. When the array substrate is cut, the first barrier walls on the array substrate will block and relieve the stress, thereby preventing the stress extending from the array substrate to the sealant and the display region. Moreover, the height of the first barrier walls is less than the distance between the array substrate and the cover plate, that is, the first barrier walls will not contact the cover plate, this prevents the first barrier walls from breaking when the stress is blocked. Thereby alleviating the technical problem that the greater cutting stress causes the sealant to appear microcracks or the film layers of the display panel broken and the encapsulation failure when the conventional display motherboard is cut.

In an embodiment, a plurality of second barrier walls are provided on the cover plate, a height of the second barrier walls is less than the distance between the array substrate and the cover plate. By setting barrier walls on the array substrate and cover plate to block and release the cutting stress. The second barrier walls can be arranged on a side of the cover plate. When the cover plate is cut, the second barrier walls on the cover plate will block and relieve the stress, thereby preventing the stress extending from the cover plate to the display region, and the display region is protected. Moreover, the height of the second barrier walls is less than the distance between the array substrate and the cover plate, that is, the second barrier walls will not contact the array substrate, and preventing the stress that cause the barrier walls to break. Thereby alleviating the technical problem that the greater cutting stress causes the sealant to appear microcracks or the film layers of the display panel broken and the encapsulation failure when the conventional display motherboard is cut.

Figure 5:
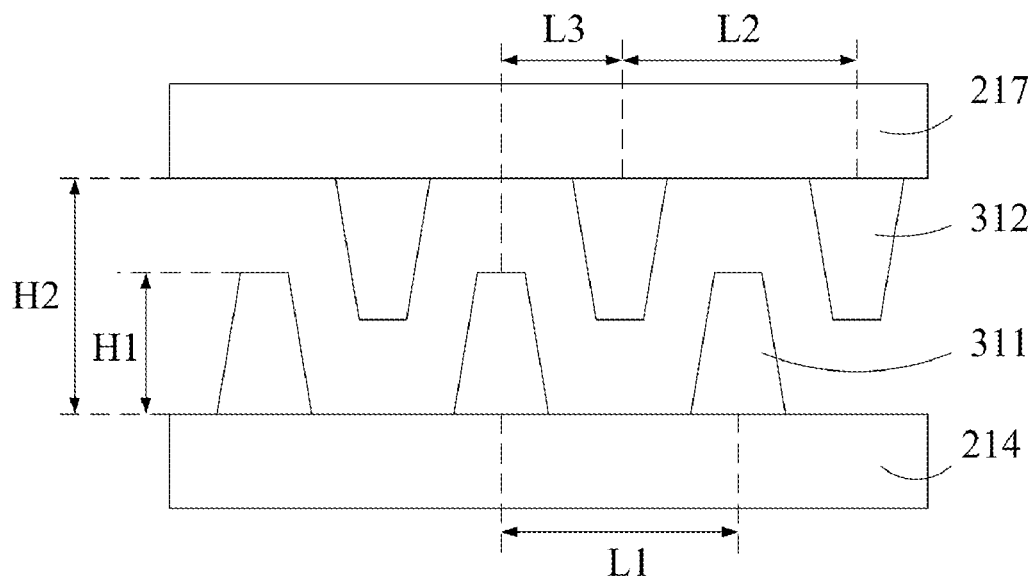
FIG. 5 is a third schematic diagram of a display motherboard provided by an embodiment of the present application.

In an embodiment, as shown in FIG. 5, a plurality of third barrier walls 311 are provided on the array substrate 214, a plurality of fourth barrier walls 312 are provided on the cover 217, and the third barrier walls 311 and the fourth barrier walls 312 are arranged in stagger. By setting barrier walls on the array substrate and cover plate to block and release the cutting stress. The third barrier walls can be arranged on the side of the array substrate and the fourth barrier walls can be arranged on the side of the cover plate, therefore both sides of the array substrate and the cove plate can be configured to block and release the cutting stress, thereby preventing the stress extending from the cover plate and the array substrate to the display region. Meanwhile, the third barrier walls and the fourth barrier walls are arranged to cross each other, so that a space of the non-display region can be fully utilized, thereby preventing the non-display region from being large and lead to a wider frame. The third barrier walls and the fourth barrier walls are arranged in stagger and opposite to each other to help cutting stresses to cancel each other. Moreover, the third barrier walls are not in contact with the fourth barrier walls, so as to prevent the third barrier walls and the fourth barrier walls from being broken by the stress when the third barrier walls and the fourth barrier walls are connected. When the space of the non-display region is fully utilized, by providing barrier walls on the both sides of the array substrate and the cover plate, the stress is prevented from extending from the sides of the array substrate and the cover plate to the sealant and the display region. Thereby alleviating the technical problem that the greater cutting stress causes the sealant to appear microcracks or the film layers of the display panel broken and the encapsulation failure when the conventional display motherboard is cut.

In an embodiment, a distance between adjacent third barrier walls is equal, and a distance between adjacent fourth barrier walls is equal. By setting the distance between the third barrier walls to be equal, the distance between the fourth barrier walls to be equal, so that the space can be fully utilized when the third barrier walls and the fourth barrier walls are arranged. When numbers of third barrier walls and the fourth barrier walls are relatively large, when blocking and releasing stress, the stress is more dispersed through repeatedly blocking and repeatedly releasing, so that the stress will not enter the sealant and the display region, and the barrier walls will not be subjected to stress fracture.

In an embodiment, as shown in FIG. 5, the distance L1 between the third barrier walls 311 is equal to the distance L2 between the fourth barrier walls 312, and a distance L3 between the third barrier wall 311 and the fourth barrier wall 312 is equal to one half of the distance L1, that is, when the third barrier wall and the fourth barrier wall are set, the distance between the third barrier walls is set equal to the distance between the fourth barrier walls, and the distance between the third and fourth barrier walls is equal to one half of the distance between the third barrier walls, when the distance between the adjacent third and fourth barrier walls are kept at a certain distance, the number of barrier walls can be relatively large. Moreover, the distance between adjacent barrier walls is the same, the adjacent barrier walls will not in contact to each other, so that the space in the non-display region can be fully utilized. In the display region, the adjacent barrier walls will not touch, and at the same time, the number of barrier walls is relatively large, so the number of barrier walls set on the sides of the cover plate and the array substrate side is large, and the stress is blocked and released better. Thereby alleviating the technical problem that the greater cutting stress causes the sealant to appear microcracks or the film layers of the display panel broken and the encapsulation failure when the conventional display motherboard is cut.

In an embodiment, the distance between adjacent third barrier walls is not equal, the distance between adjacent fourth barrier walls is not equal, and the third barrier walls are not in contact with the fourth barrier walls. Considering that there are other structures in the non-display region, when the third barrier walls and the fourth barrier walls are arranged, they can be set according to arrangements of other structures. Other structures include circuits, when the third barrier walls and fourth barrier walls are arranged, keep away from an arrangement of the circuits, so that the third barrier walls and the fourth barrier walls will not affect an installation of other structures when the third barrier walls and the fourth barrier walls block and release the stress. Meanwhile, the third barrier walls and the fourth barrier walls do in contact to each other, thereby preventing the third barrier walls and the fourth barrier walls from breaking when the stress is blocked.

In an embodiment, as shown in FIG. 5, a height H1 of the third barrier walls 311 ranges from one half to two-third of the distance H2 between the array substrate 214 and the cover plate 217. When setting the height of the third barrier walls, in order to prevent the third barrier walls from contacting the cover plate, the height of the third barrier walls is less than the distance between the array substrate and the cover plate, but in order to improve blocking and releasing of the cutting stress, the third barrier walls are set higher to better block and release the cutting stress. Therefore, the height the third barrier walls ranges from one half to two-thirds of the distance between the array substrate and the cover plate, so that the height of the third barrier walls is higher, and an effect of blocking and releasing the cutting stress is better. At the same time, the third barrier walls will not in contact with the cover plate to prevent the third barrier walls from breaking.

In an embodiment, a height of the fourth barrier walls ranges from one half to two-thirds of the distance between the array substrate and the cover plate. When the fourth barrier walls are provided, in order to prevent the fourth barrier walls from contacting the array substrate, the height of the fourth barrier walls is less than the distance between the array substrate and the cover plate, but in order to improve blocking and releasing of the cutting stress, the fourth barrier walls are set higher to better block and release the cutting stress. Therefore, the height the fourth barrier walls ranges from one half to two-thirds of the distance between the array substrate and the cover plate, so that the height of the fourth barrier walls is higher, and the effect of blocking and releasing the cutting stress is better. At the same time, the fourth barrier walls will not in contact with the array substrate to prevent the fourth barrier walls from breaking.

In an embodiment, a plurality of fifth barrier wall are provided on the array substrate, a plurality of sixth barrier walls are provided on the cover plate, the fifth barrier walls are arranged corresponding to the sixth barrier walls, a height of the fifth barrier walls is less than one half of the distance between the array substrate and the cover plate, and a height of the sixth barrier walls is less than one half of the distance between the array substrate and the cover plate. When the fifth barrier walls and the sixth barrier walls are arranged on the array substrate and the cover plate, the height of the barrier walls can be reduced, and a density of the barrier walls can be increased to block the stress. Specifically, the height of the fifth barrier walls and the sixth barrier walls can be set to be less than one half of the distance between the array substrate and the cover plate, so that the fifth barrier walls and the sixth barrier walls will not contact o each other. Meanwhile, the fifth barrier walls and the sixth barrier walls are arranged corresponding to each other, that is, positions of the fifth barrier walls and the sixth barrier walls can correspond, and number of the fifth barrier walls can be same as that of the sixth barrier walls, the density of the fifth barrier walls on the side of the array substrate and the density of the sixth barrier walls on the side of the cover plate are higher, by repeatedly blocking and repeatedly releasing of the cutting stress to prevent the cutting stress from entering the sealant and display region. Thereby alleviating the technical problem that the greater cutting stress causes the sealant to appear microcracks or the film layers of the display panel broken and the encapsulation failure when the conventional display motherboard is cut.

In an embodiment, the display motherboard is a liquid crystal display motherboard. For preventing display panels from damage of the cutting stress, the liquid crystal display motherboard can also be protected by providing of barrier walls to protect liquid crystal display panels, preventing the liquid crystal display panels from breaking.

In an embodiment, the liquid crystal display motherboard includes the liquid crystal display panels, each of the liquid crystal display panels includes the array substrate, a first substrate arranged opposite to the array substrate, and a liquid crystal layer disposed between the array substrate and the first substrate.

In an embodiment, the first substrate is a color filter substrate.

In an embodiment, the array substrate is a color on array (COA) substrate, that is, a color filter layer arranged on the array substrate.

Figure 6:
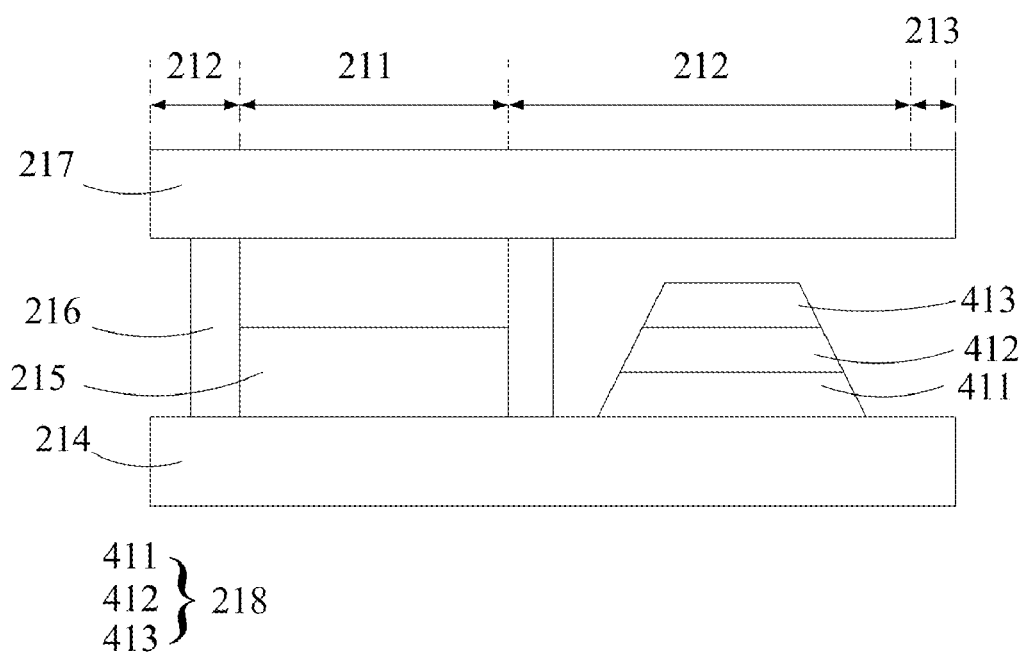
FIG. 6 is a fourth schematic diagram of a display motherboard provided by an embodiment of the present application.

In an embodiment, as shown in FIG. 6, the barrier wall 218 includes a light-shielding layer 411, a buffer layer 412, and a photoresist layer 413. The buffer layer 218 is disposed between the light-shielding layer 411 and the photoresist layer 413, and the light-shielding layer 218 is in contact with at least one of the array substrate 214 or the cover plate 217. When the barrier walls are provided, the light-shielding layer, the buffer layer, and the photoresist layer can be configured to form the barrier walls, so that the barrier walls can block and release the stress. Thereby alleviating the technical problem that the greater cutting stress causes the sealant to appear microcracks or the film layers of the display panel broken and the encapsulation failure when the conventional display motherboard is cut.

In an embodiment, material of the light-shielding layer includes at least one of copper, aluminum, or titanium.

In an embodiment, material of the buffer layer includes at least one of silicon oxide or silicon nitride.

In an embodiment, material of the photoresist layer includes polyimide.

Figure 7:
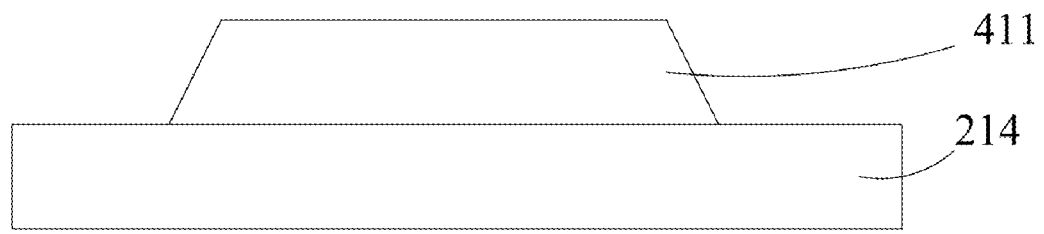
FIG. 7 is schematic flowcharts of a barrier wall corresponding to each step of a method of manufacturing barrier walls provided by an embodiment of the present application.
Figure 7:
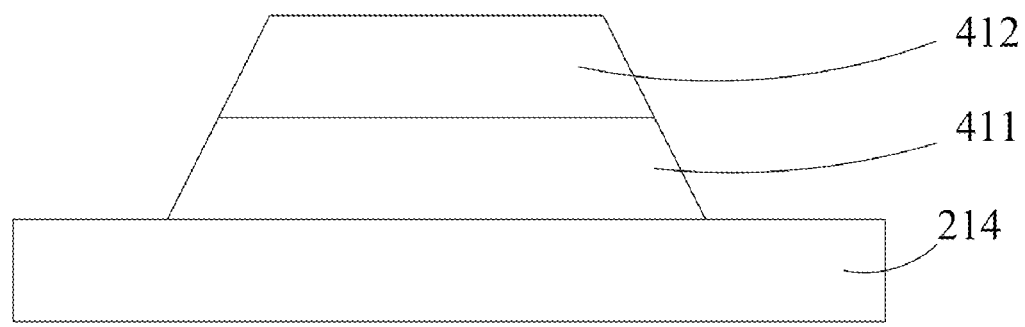
Figure 7:
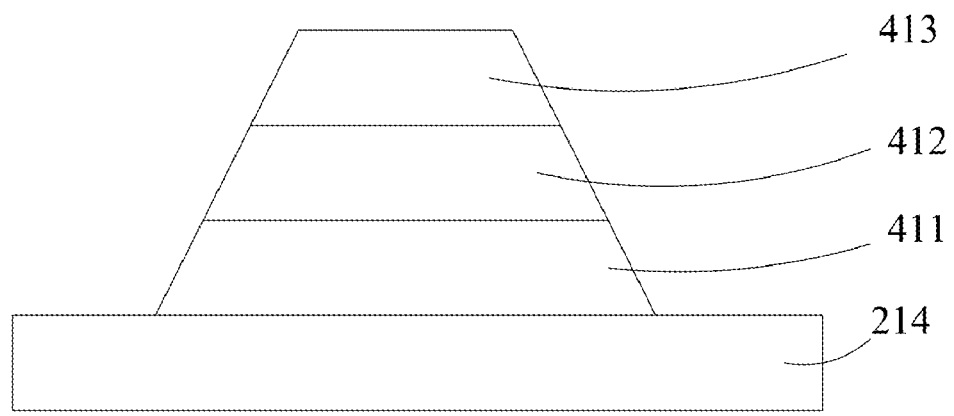

In an embodiment, a method of manufacturing the barrier wall includes:

forming the light-shielding layer 411 on the array substrate 214, wherein a structure of the barrier wall is shown in (a) of FIG. 7;

forming the buffer layer 412 on the light-shielding layer 411, wherein the structure of the barrier wall is shown in (b) of FIG. 7; and forming the photoresist layer 413 on the buffer layer 412, wherein the structure of the barrier wall is shown in (c) of FIG. 7.

In an embodiment, a shape of the barrier wall includes rectangular, inverted trapezoidal, or triangular. When the shape of the barrier wall is set, the barrier wall can be made into various shapes, which can be configured to block and release the stress is better as a benchmark.

In an embodiment, a width of the barrier wall ranges from 1 micrometer to 20 micrometers.

In an embodiment, the height of the barrier wall ranges from 1 micrometer to 20 micrometers.

In an embodiment, the distance between adjacent barrier walls ranges from 1 micrometer to 20 micrometers.

It can be known from the above embodiments:

an embodiment of the present application provides a display motherboard, the display motherboard includes the display panels and the cutting region arranged between the display panels. Each of the display panels includes the display region, and the non-display region arranged between the display region and the cutting region. Wherein, the display panel includes the array substrate and the cover plate, at least one of the array substrate or the cover plate is provided with the barrier walls in the non-display region, and the barrier walls are configured to block and release cutting stress. By setting the barrier walls on at least one of the array substrate or the cover plate in the non-display region, stress generated by the cutting will be blocked and released by the barrier walls when the display motherboard is cut. So that the stress will not enter the sealant and the display region, and the stress is released, thereby to prevent microcracks in the sealant and even fractures in films of the display motherboard. Moreover, the stress cannot enter the display region, and the encapsulation of the display region is complete, thereby alleviating the technical problem of encapsulation failure when the conventional display motherboard is cut, where the greater cutting stress causes microcracks in the sealant or cracks in films of the display panel.

It can be understood that for those of ordinary skill in the art, equivalent substitutions or modifications can be made according to the technical solutions and inventive concepts of the present application, and all these modifications or substitutions shall fall within the protection scope of the appended claims of the present application.

What is claimed is:

1. A display motherboard, comprising a plurality of display panels and a cutting region arranged between the display panels, wherein each of the display panels comprises:
   a display region; and
   a non-display region arranged between the display region and the cutting region,
   wherein each of the display panels further comprises an array substrate and a cover plate;
   a plurality of first barrier walls are disposed on a side of the array substrate facing the cover plate in the non-display region, and a plurality of second barrier walls are disposed on a side of the cover plate facing the array substrate in the non-display region; and
   a height of each of the first barrier walls and the second barrier walls is less than a distance between the array substrate and the cover plate.

2. The display motherboard as claimed in claim 1, wherein the display motherboard is an organic light-emitting diode (OLED) display motherboard, a light-emitting functional layer is positioned in the display region, an encapsulation glue is provided in the non-display region, and the encapsulation glue is arranged around the light-emitting functional layer.

3. The display motherboard as claimed in claim 2, wherein the first barrier walls and the second barrier walls are arranged in stagger.

4. The display motherboard as claimed in claim 3, wherein distances defined between adjacent first barrier walls are equal, and distances defined between adjacent second barrier walls are equal.

5. The display motherboard as claimed in claim 4, wherein the distance between the adjacent first barrier walls is equal to the distance between the adjacent second barrier walls, and distances defined between the first barrier walls and adjacent second barrier walls are equal to one half of the distance between the first barrier walls.

6. The display motherboard as claimed in claim 5, wherein the height of each of the first barrier walls ranges from one half to two-thirds of the distance between the array substrate and the cover plate.

7. The display motherboard as claimed in claim 5, wherein the height of each of the second barrier walls ranges from one half to two-thirds of the distance between the array substrate and the cover plate.

8. The display motherboard as claimed in claim 2, wherein the first barrier walls and the second barrier walls are arranged opposite to each other, the height of each of the first barrier walls is less than one-half of the distance between the array substrate and the cover plate, and the height of each of the second barrier walls is less than one half of the distance between the array substrate and the cover plate.

9. The display motherboard as claimed in claim 1, wherein the display motherboard is a liquid crystal display motherboard.

10. The display motherboard as claimed in claim 9, wherein the liquid crystal display motherboard is a liquid crystal display panel, the liquid crystal display panel comprises the array substrate, a first substrate arranged opposite to the array substrate, and a liquid crystal layer disposed between the array substrate and the first substrate.

11. The display motherboard as claimed in claim 10, wherein the first substrate is a color filter substrate.

12. The display motherboard as claimed in claim 1, wherein each of the first barrier walls and the second barrier walls comprises a light-shielding layer, a buffer layer, and a photoresist layer, the buffer layer is disposed between the light-shielding layer and the photoresist layer, and the light-shielding layer is in contact with at least one of the array substrate or the cover plate.

13. The display motherboard as claimed in claim 12, wherein a material of the light-shielding layer comprises at least one of copper, aluminum, or titanium.

14. The display motherboard as claimed in claim 12, wherein a material of the buffer layer comprises at least one of silicon oxide or silicon nitride.

15. The display motherboard as claimed in claim 12, wherein a material of the photoresist layer comprises polyimide.

16. The display motherboard as claimed in claim 1, wherein a cross-sectional shape of each of the first barrier walls and the second barrier walls comprises rectangular, inverted trapezoidal, or triangular.

17. The display motherboard as claimed in claim 16, wherein a width of each of the first barrier walls and the second barrier walls ranges from 1 micrometer to 20 micrometers.

18. The display motherboard as claimed in claim 16, wherein a height of each of the first barrier walls and the second barrier walls ranges from 1 micrometer to 20 micrometers.

* * * * *